(12) United States Patent
Kihara et al.

(10) Patent No.: US 7,496,024 B2
(45) Date of Patent: Feb. 24, 2009

(54) HOLOGRAM APPARATUS AND HOLOGRAM RECORDING METHOD

(75) Inventors: Nobuhiro Kihara, Kanagawa (JP);
Hisayuki Yamatsu, Tokyo (JP);
Megumi Ezura, Tokyo (JP)

(73) Assignee: Sony Corporation, Tokyo (JP)

( * ) Notice: Subject to any disclaimer, the term of this patent is extended or adjusted under 35 U.S.C. 154(b) by 644 days.

(21) Appl. No.: 11/177,429

(22) Filed: Jul. 11, 2005

(65) Prior Publication Data
US 2006/0013104 A1   Jan. 19, 2006

(30) Foreign Application Priority Data
Jul. 13, 2004   (JP)   ............... 2004-205999

(51) Int. Cl.
*G11B 7/00* (2006.01)
(52) U.S. Cl. .................................. 369/103
(58) Field of Classification Search ............... 369/103, 369/126; 359/24
See application file for complete search history.

(56) References Cited

U.S. PATENT DOCUMENTS
6,108,110 A    8/2000  Orlov et al.
6,614,566 B1 *  9/2003  Curtis et al. .............. 359/24
7,277,211 B2 * 10/2007  Baba et al. ................ 359/24
7,362,687 B2 *  4/2008  Tsukagoshi ............. 369/103

OTHER PUBLICATIONS

Masatoshi Bunsen, et al., "Hologram Multiplexing with photorefractive beam-fanning speckle", Optics Communications, vol. 235, No. 1-3, May 1, 2004, pp. 41-47.

* cited by examiner

*Primary Examiner*—Nabil Z Hindi
(74) *Attorney, Agent, or Firm*—Oblon, Spivak, McClelland, Maier & Neustadt, P.C.

(57) ABSTRACT

The present invention provides a hologram apparatus for recording an interference fringe of a signal beam and a reference beam having a speckle pattern in a recording area of a hologram recording material. The hologram apparatus includes a speckle pattern generating unit for generating the speckle pattern so that the speckle pattern is different in form in the track direction and the cross-track direction of the recording area. With this configuration, it is possible to perform recording under an increased tolerance in the cross-track direction while securing the shift selectivity necessary in the track direction, and, hence, to easily and stably perform the tracking servo at the time of reproduction.

20 Claims, 10 Drawing Sheets

P → (TRACK DIRECTION)

Q → (CROSS-TRACK DIRECTION)

ORTHOGONAL DIRECTION

SHIFTING DIRECTION

HOLOGRAM APPARATUS AND HOLOGRAM RECORDING METHOD

BACKGROUND OF THE INVENTION

The present invention relates to a hologram apparatus for performing volume recording of a hologram on a hologram recording material, and particularly to a hologram recording method for easily performing tracking servo at the time of reproduction.

In recent years, there have been proposed holographic storage systems for recording/reproduction of a large capacity of data by utilizing the hologram technology. The holographic storage systems include a recording system in which a hologram recording material (hereinafter sometimes referred to simply as recording material) is irradiated, at predetermined angles, with both a signal beam including recording data generated by space light modulation means such as a liquid crystal device and a reference beam set according to the signal beam so that an interference fringe generated by the signal beam and the reference beam is recorded on the recording material, and a reproduction system in which the hologram recording material is irradiated with a reproduction illumination beam to generate a diffracted beam (reproduced signal beam) corresponding to the recorded interference fringe, and the diffracted beam is received by a light receiving device such as a CCD image sensor and analyzed to reproduce the data. Incidentally, the hologram thus recorded per space light modulation means is called a page.

In addition, in the holographic storage system, a technique called multiplex recording is used for enhancing the recording density. Unlike the recording on an optical disk in the past, the multiplex recording resides in recording a multiplicity of independent pages in a single location. Representative known examples of the multiplex recording system include angle multiplex recording system, shift multiplex recording system, phase code multiplex recording system, and other many multiplexing systems.

The angle multiplexing system records and reproduces a multiplicity of independent pages in a single location by varying the angle of the reference beam. The shift multiplexing performs multiplex recording by shifting the recording position little by little. The phase code multiplexing records data by simultaneously radiating the reference beams from various directions in recording one page, while the reference beams from various directions are provided with phase variations. The angle multiplexing system records and reproduces a multiplicity of independent pages in a single location by combining the phase variations in various ways.

Besides, many multiplexing systems are known in addition to the above three kinds. For example, the systems pertaining to the present application include a system called speckle multiplexing (or correlation multiplexing) described, for example, in Holographic Data Storage; H. J. Coufal, D. Psaltis, G. T. Sincerbox ED; Springer; p. 47 Volume Holographic Multiplexing Methods, which will be described in detail below.

The speckle multiplexing is a method in which a diffusing body, for example, is placed in the optical path of the reference beam, and the reference beam diffused by the diffusing body and the signal beam are brought into interference with each other in a recording material. Generally, a laser beam having undergone random diffusion has, as a result of random interference, a random intensity distribution called a speckle pattern. Namely, in the speckle multiplexing system, the speckle pattern and the signal beam interfere with each other. The hologram recorded in this manner is characterized in that the image would not be reproduced after a displacement by a distance equivalent to the speckle size. The multiplexing method utilizing this characteristic feature is the speckle multiplexing (or correlation multiplexing), which has the merit that it is possible to record in a higher density (hence, to be better in shift selectivity) than in shift multiplexing using a spherical wave.

For example, shift recording as shown in FIG. 12 may be conducted by utilizing a hologram based on the speckle multiplexing system. For easy understanding of the discussion, it is assumed that the recording is conducted on a rotating disk type recording material such as an optical disk and that the shifting direction coincides with the rotating direction of the disk. Reading is also conducted while rotating the disk. In this figure, one circle represents one hologram page of recording area. However, the shape of the recording area is not limited to the circle and may be an ellipse or a rectangle. Reproduction of the hologram thus recorded will be considered. Incidentally, the holograms do not overlap in the orthogonal direction (cross-track direction), they may overlap in that direction.

In the optical disks in the past, the shifting direction is also called the track direction, while the direction orthogonal to the shifting direction is called the cross-track direction, and the servo against the crosswise deviations of the position in the track direction attendant on the rotation of the disk (i.e., tracking servo) has had an important role in reproduction. Incidentally, deviation amounts of several tens to several hundreds of micrometers have been permitted in the cases of the optical disks in the past.

SUMMARY OF THE INVENTION

As to the crosswise deviations of the position in the track direction, the same situation exists also in the holographic storage and, hence, a system like the tracking servo may be needed. In the speckle multiplexing system, however, it is a general practice to set the shift selectivity in the range of from several micrometers to several tens of micrometers for earning the recording capacity. The high selectivity is necessary in the shifting direction, but it makes it difficult to apply the tracking servo in the cross-track direction. Specifically, it is difficult to apply the tracking servo at the time of reproduction, unless the shift selectivity in the cross-track direction is lowered, i.e., unless the tolerance in the cross-track direction is increased.

Thus, there is a need for a hologram apparatus and a hologram recording method by which it is possible to easily and stably achieving the tracking servo at the time of reproduction, by recording under an increased tolerance in the cross-track direction while securing the shift selectivity necessary in the track direction of the recording area of a hologram recording material.

According to an embodiment of the present invention, there is provided a hologram apparatus for recording an interference fringe of a signal beam and a reference beam having a speckle pattern in a recording area of a hologram recording material. A speckle pattern generating unit is provided for generating the speckle pattern so that the speckle pattern is different in form in the track direction and the cross-track direction of the recording area.

Thus, in an embodiment of the present invention, for example, the hologram recording material is irradiated with the reference beam having been passed through a diffuser plate shaped to be elongate in the track direction of the recording area of the hologram recording material, whereby the reference beam having a speckle pattern having a larger granular shape in the cross-track direction than the track direction of the recording area is produced, and recording is conducted by irradiating the recording area of the hologram recording material with the reference beam having the speckle pattern. Therefore, it is possible to perform recording under an increased tolerance in the cross-track direction while securing the shift selectivity necessary in the track direction, and, hence, to easily and stably perform the tracking servo at the time of reproduction.

According to the present invention, by using the reference beam different in form of the speckle pattern in the track direction and the cross-track direction of the recording area of the hologram recording material, it is possible to perform recording under an increased tolerance in the cross-track direction while securing the shift selectivity necessary in the track direction, and, hence, to easily and stably perform the tracking servo at the time of reproduction.

In addition, owing to the above effect, the recording density in the track direction in the recording area of the hologram recording material can be enhanced without being bundled by the limit of tracking servo, and, therefore, the recording density can be raised to the upper limit determined by the dynamic range of the recording material.

DETAILED DESCRIPTION OF THE PREFERRED EMBODIMENTS

According to the present invention, it is possible to perform recording under an increased tolerance in the cross-track direction while securing the shift selectivity necessary in the track direction of the recording area of the hologram recording material. Therefore, the need for easily and stably performing the tracking servo at the time of reproduction has been met by use of a reference beam of which the form of the speckle pattern is different in the track direction and the cross-track direction in the recording area of the hologram recording material.

EXAMPLE 1

Figure 1:
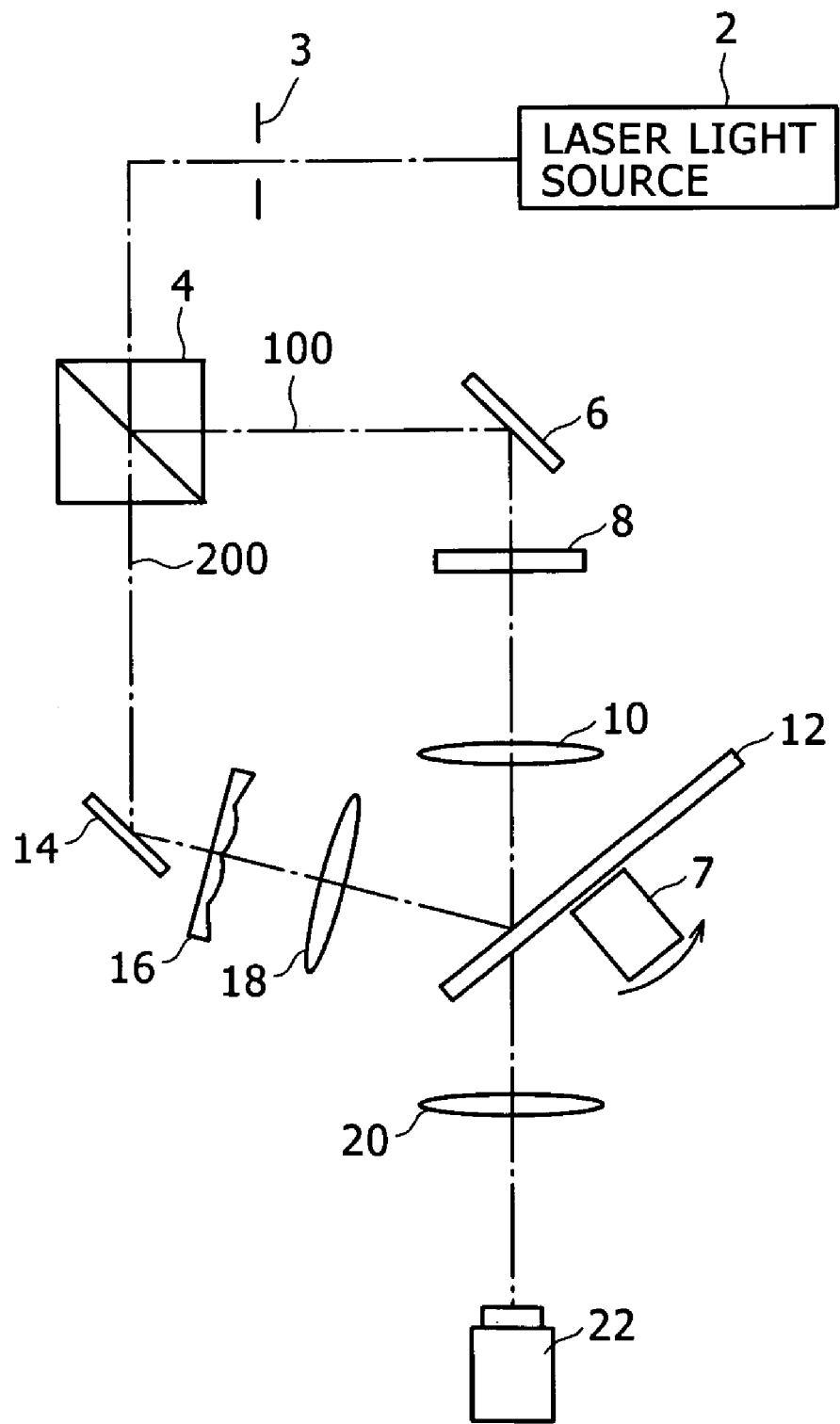
FIG. 1 is a schematic diagram showing the configuration of a hologram recording/reproduction apparatus according to a first embodiment of the present invention.

FIG. 1 is a schematic diagram showing the configuration of a hologram recording/reproduction apparatus according to a first embodiment of the present invention. The hologram recording/reproduction apparatus includes a laser light source 2, a shutter 3, a beam splitter 4, a mirror 6, a space light modulator 8, a lens 10, a disk form hologram recording material (made of a photopolymer or the like) 12, a mirror 14, a diffuser plate 16 for dispersing a reference beam 200 to render the wave front speckle-like in shape, a lens 18, a lens 20, a detector 22, and a spindle motor 7.

Now, the operation of this embodiment will be described. In FIG. 1, in the case of recording data on the hologram recording material 12, with the shutter 3 in a closed state, the data page to be recorded is displayed on the space light modulator (transmitting liquid crystal display apparatus) 8, the spindle motor 7 is rotated to determine the recording site (recording area) of the hologram recording material 12, and then the shutter 3 is opened.

As a result, a coherent laser beam emitted from the laser light source 2 passes through the shutter 3 to be incident on the beam splitter 4, where it is branched into a signal beam 100 and the reference beam 200. The signal beam 100 is incident through the mirror 6 on the space light modulator 8, and the signal beam 100 passes through the space light modulator 8 on which the data page is displayed, thereby undergoing space light modulation (intensity modulation). The signal beam thus modulated is condensed by the lens 10 into the recording area in the hologram recording material 12.

On the other hand, the reference beam 200 is incident through the mirror 14 on the diffuser plate 16, thereby being converted into a reference beam having a speckle shaped wave front, and then it is condensed by the lens 18 into the same condensation point as the signal beam 100 in the hologram recording material 12. As a result, in the hologram recording material 12, the signal beam 100 and the reference beam 200 are overlapped on each other at the condensation point, and the resultant interference fringe is recorded in the hologram recording material 12 as a minute coarse-dense pattern.

Thereafter, the data page to be recorded next is displayed on the space light modulator 8, and the hologram recording material 12 is shifted by δ by minutely rotating the spindle motor 7, whereon the portion into which the signal beam 100 and the reference beam 200 are condensed is moved by δ. In this condition, with the shutter 3 opened, the data page to be recorded next is recorded in the condensation region (recording area) of the signal beam 100 and the reference beam 200 in the hologram recording material 12 by speckle multiplex recording.

Figure 2A:
FIGS. 2A and 2B illustrate the forms of the recording area in the case where speckle multiplex recording is carried out by the apparatus shown in FIG. 1.
Figure 2B:
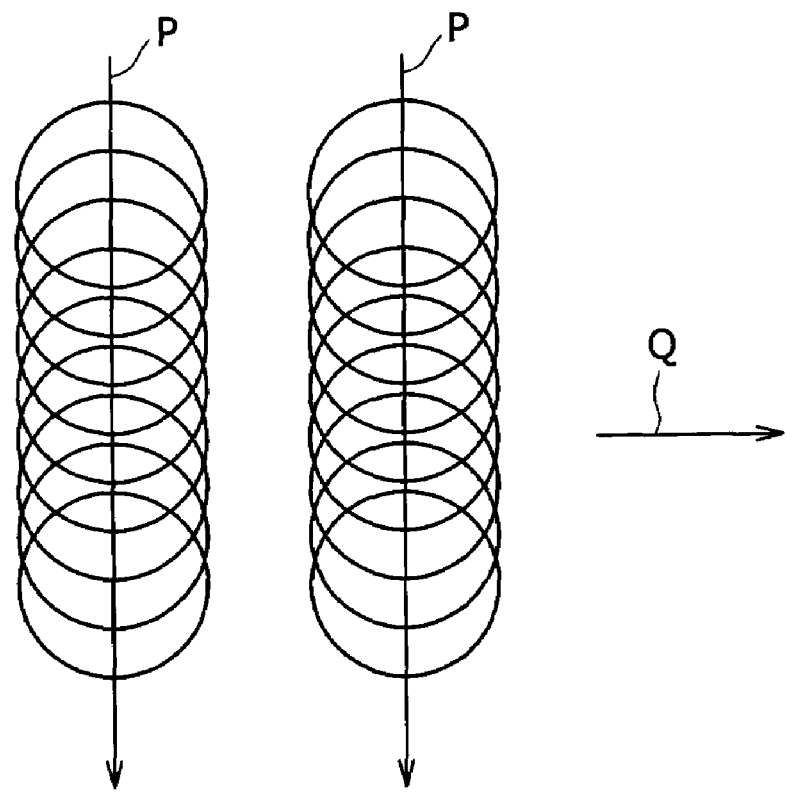

FIGS. 2A and 2B are schematic diagrams showing the form of the recording areas in the disk form hologram recording material 12 in the case of the speckle multiplex recording as above-mentioned. As shown in FIG. 2A, the speckle multiplex recording is conducted in the track direction (circumferential direction) of the disk form hologram recording material 12. Each of the circles shown FIG. 2B is the recording area. The recording areas are produced and overlap at an interval of σ in the track direction (the direction of arrow P) in the multiplex recording. The direction of arrow Q in FIG. 2B is the cross-track direction.

Figure 3:
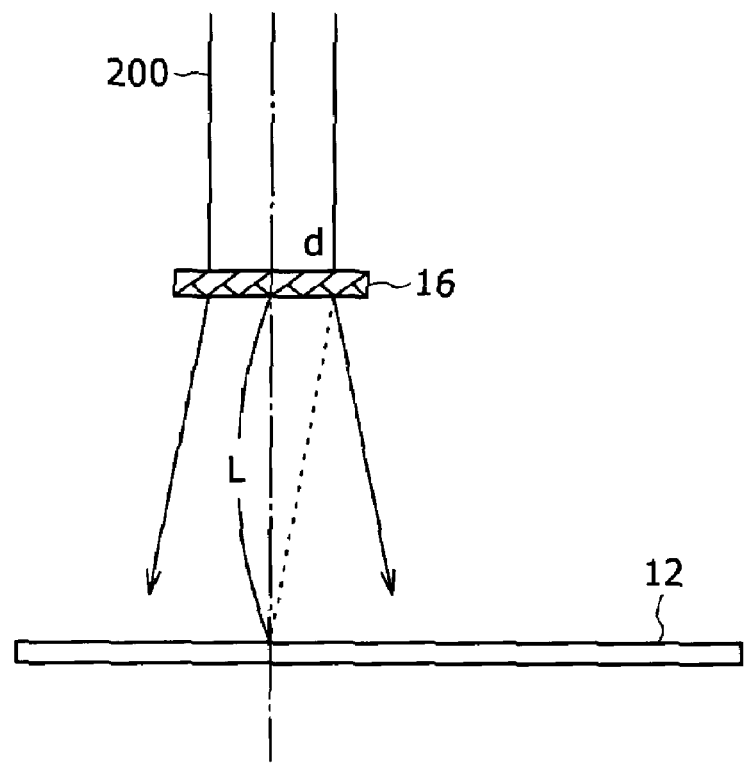
FIG. 3 illustrates the function of a diffuser plate shown in FIG. 1.

As to the shift selectivity in the case of recording a speckle multiplex hologram by use of the above-mentioned reference beam optical system, a relationship has already been known. Specifically, the shift selectivity in the speckle multiplexing system is determined by the speckle size of the reference beam, and, in FIG. 3, the speckle size of the reference beam is determined by the numerical aperture of the reference beam wave as viewed from the hologram recording material. To be more specific, the in-plane average speckle size δ of the hologram recording material is given by δ=1.22 λL/d, where λ is the wavelength of the reference beam 200, L is the distance between the diffuser plate 16 and the hologram recording material 12, and d is the diameter of the beam spot with which the diffuser plate 16 is irradiated.

Therefore, in the speckle multiplexing optical system using such a reference beam as above, the shift selectivity is on the order of δ. In the past, however, a basically isotropic diffuser plate was used, and the shape of the diffuser plate was not determined by taking into account the shifting direction of the recording material. Therefore, the shift selectivity has been basically isotropic, and, as a result, the shift selectivity has been the same in the track direction and in the cross-track direction. The shift selectivity is equivalent to the tolerance of the system, from another point of view, and, if the shift selectivity is excessively high, the tolerance would be reduced, and needless burden would be exerted on the servo and the peripheral accuracies.

Figure 4:
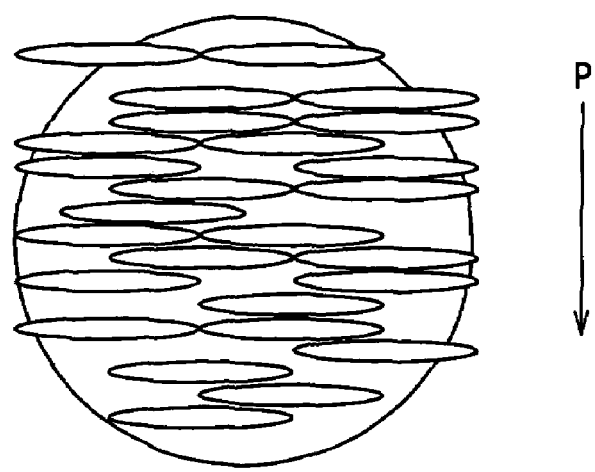
FIG. 4 shows the form of a reference beam having passed through the diffuser plate of FIG. 3.

In view of the above, in this embodiment, there is used the diffuser plate 16 for generating the reference beam 200 having a speckle pattern having different sized in the track direction and in the cross-track direction as shown in FIG. 4. Such a reference beam 200, as for example shown in FIG. 4, has such a condition that the speckle patterns are coarse in the cross-track direction and dense in the track direction, i.e., the reference beam 200 has a granular form larger in the cross-track direction than in the track direction.

Figure 5A:
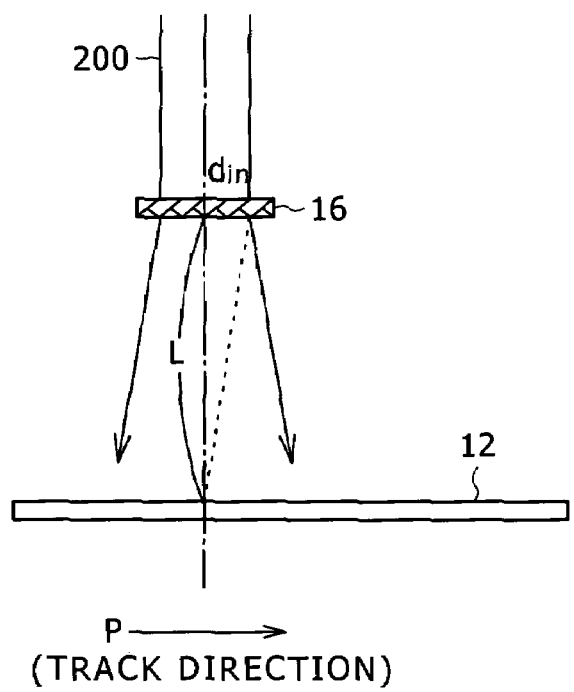
FIGS. 5A and 5B illustrate the functions, in the track direction and the cross-track direction, of the diffuser plate shown in FIG. 1.
Figure 5B:
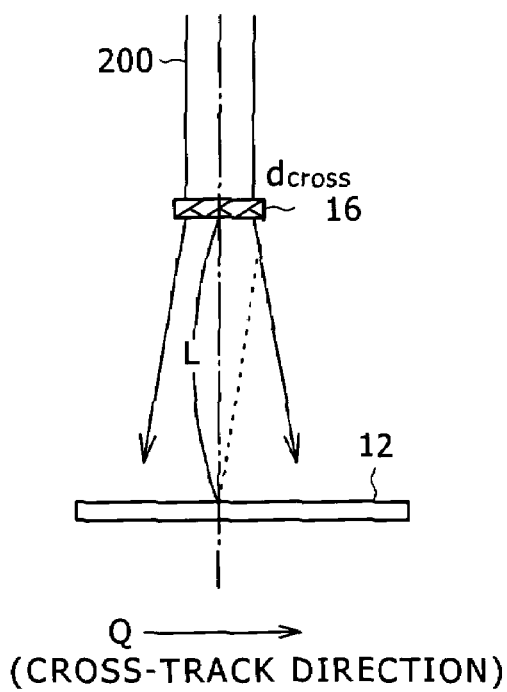

In order to generate such speckle patterns, it may be necessary that the numerical aperture of the reference beam as viewed from the hologram recording material is different in the shifting direction and the cross-track direction, and the numerical aperture is smaller in the cross-track direction than in the shifting direction. For this purpose, it suffices that the range of illumination beam illuminating the diffuser plate 16 is longer in the track direction as shown in FIG. 5A, and the range of illumination beam illuminating the diffuser plate 16 is shorter in the cross-track direction as shown in FIG. 5B; in short, in the case of arrangement shown in FIGS. 5A and 5B, by setting $d_{in} > d_{cross}$, it is possible to form a speckle pattern which is elongate in the cross-track direction.

According to this embodiment, the reference beam 200 having the speckle pattern having different forms in the shifting direction and the cross-track direction is generated by the diffuser plate 16 having an elongate shape, and an interference fringe of the reference beam 200 and the signal beam 100 is recorded, whereby it is possible to perform recording under an increased tolerance in the cross-track direction while securing the shift selectivity necessary in the track direction, and, hence, to easily and stably perform the tracking servo at the time of reproduction.

Incidentally, it is seen from the theory of speckles that the diffusion angle of the diffuser plate 16 and the speckle size are normally independent from each other. As seen from FIGS. 5A and 5B, it is desirable for the diffusion angle of the diffuser plate 16 to be so set that the reference beam 200 will be spread to the desired part of the hologram recording area. Such a control of the diffusion angle can be achieved by regulating the surface roughness of the diffuser plate, and a diffracting optical device or the like may be used in place of the diffuser plate for this purpose.

EXAMPLE 2

Figure 6:
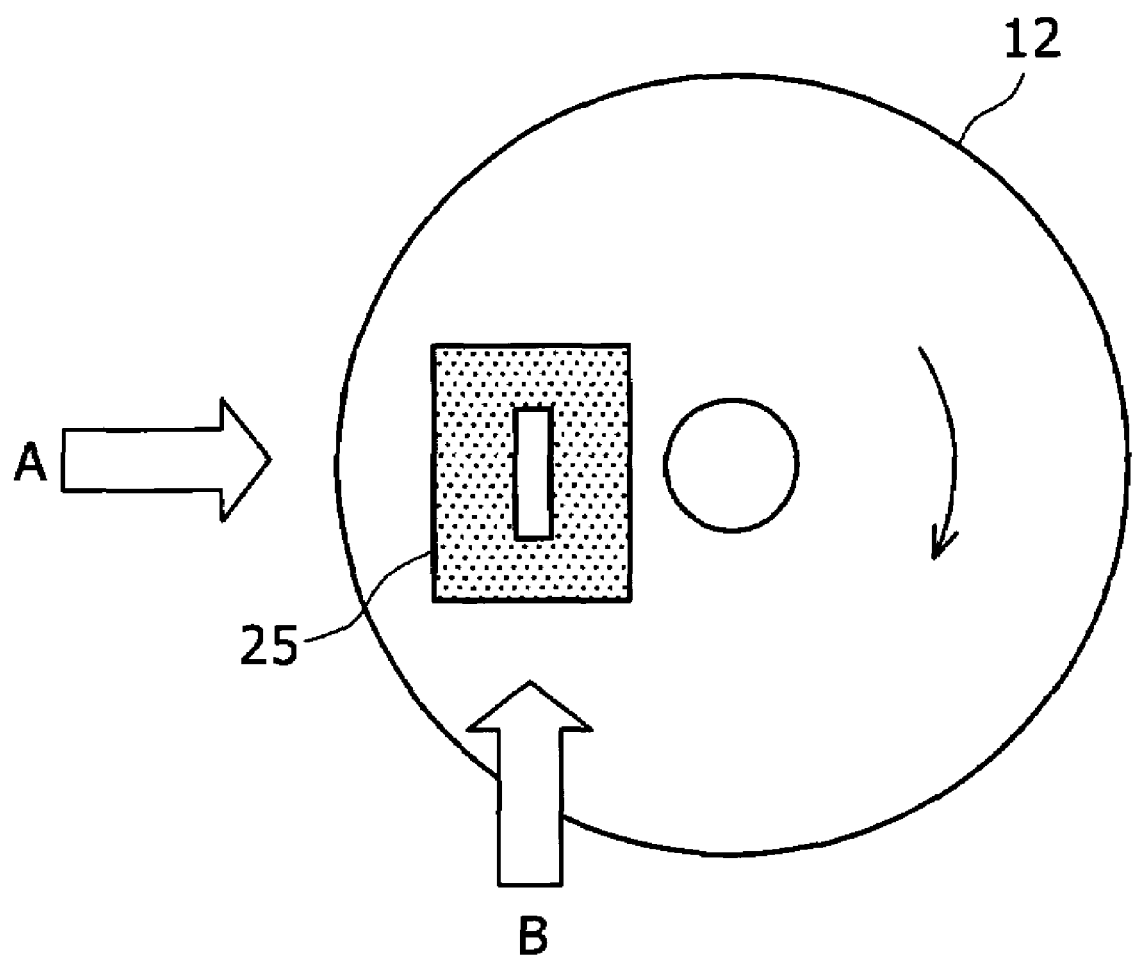
FIG. 6 is a plan view showing the configuration of a major part of a hologram recording/reproduction apparatus according to a second embodiment of the present invention.

FIG. 6 is a plan view showing the configuration of a major part of a hologram recording/reproduction apparatus according to a second embodiment of the present invention. It should be noted here that the same portions as those in the first embodiment above will be denoted by the same symbols as used above, in the following description. A reference beam optical system in the hologram recording/reproduction apparatus in this embodiment has an aperture 25, and a reference beam having passed through a diffuser plate is led through the aperture 25 to irradiate a hologram recording material 12 therewith.

Figure 7A:
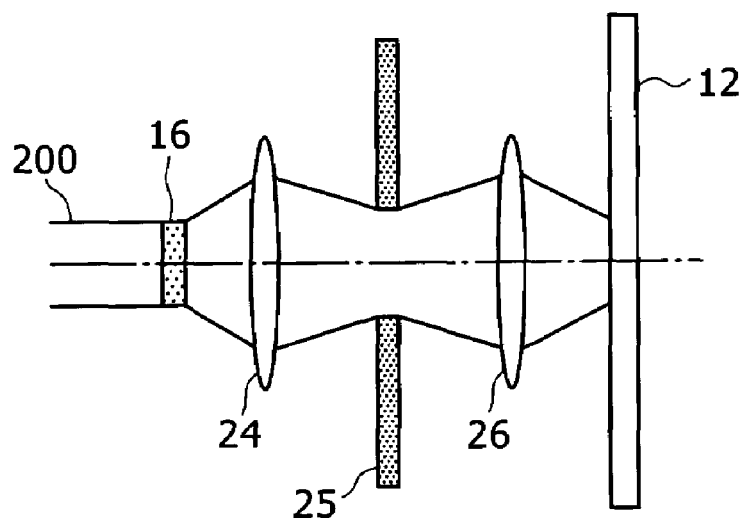
FIGS. 7A and 7B are side views as viewed in the direction of arrow A of FIG. 6, and a side view as viewed in the direction of arrow B of FIG. 6, respectively.
Figure 7B:
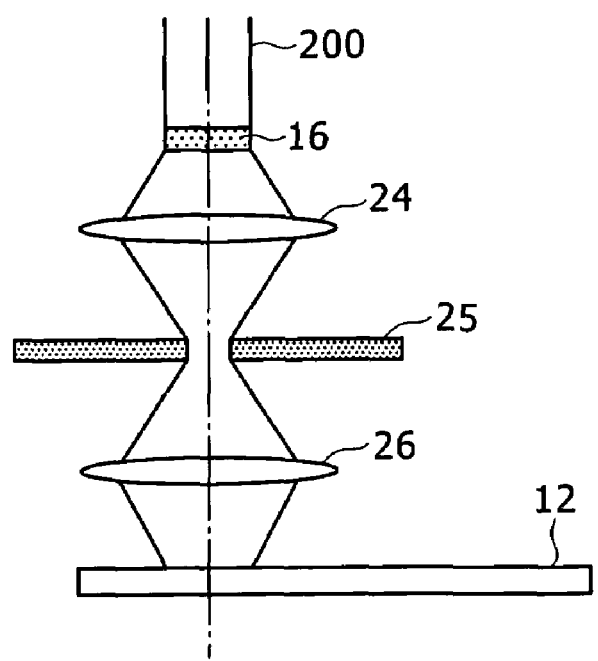

FIG. 7A is a side view of FIG. 6 as viewed in the direction of arrow A, and FIG. 7B is a side view of FIG. 6 as viewed in the direction of arrow B. The reference beam optical system of the hologram recording/reproduction apparatus includes the diffuser plate 16, a lens 24, the aperture 25, and a lens 26. The lens 24 and the lens 26 constitute a 4f optical system, which is a kind of telecentric optical system.

Now, the operation of this embodiment will be described. The reference beam 200 is treated by the diffuser plate 16 to have a speckle shaped wave front, before being condensed by the lens 24 onto the aperture 25. After passing through the aperture 25, the reference beam 200 is led by the lens 26 to irradiate the hologram recording material 12 therewith.

The aperture 25 in this embodiment is shaped to be elongate in the track direction. As the opening of the aperture 25 is larger, the numerical aperture of the reference beam wave as viewed from the hologram recording material 12 is larger, and, accordingly, the speckle pattern is smaller. The lens 24 and the lens 26 constitute a 4f optical system, so that the diffuser plate 16 and the surface of the hologram recording material 12 are in the imaging relationship. Therefore, the range of irradiation with the reference beam 200 on the hologram recording material 12 is such that the speckle pattern is smaller in the track direction, and the speckle pattern is larger in the cross-track direction. Therefore, it is possible, in the track direction, to enlarge the opening of the aperture 25 until a required shift selectivity is obtained, and it is possible, in the cross-track direction, to reduce the opening of the aperture 25 so as to obtain a large tolerance. Accordingly, it is possible to moderate various restrictions pertaining to tracking servo, eccentricity of axis, and the like.

According to this embodiment, the reference beam 200 provided with the speckle form by the diffuser plate 16 is passed through the aperture 25 which is elongate in the track direction, and the presence of the 4f optical system sets the diffuser plate 16 and the surface of the hologram recording material 12 in the imaging relationship, whereby it is possible to perform recording under an increased tolerance in the cross-track direction while securing the necessary shift selectivity in the track direction, and, hence, to easily and stably perform the tracking servo at the time of reproduction.

Incidentally, an example in which the aperture is disposed in the 4f optical system has been described in this embodiment, the same function or effect can be obtained without the aperture, if the diffusion angle of the diffuser plate is set different in the track direction and the cross-track direction. Besides, while the expression of diffuser plate has been used for convenience of description, a diffracting optical device or the like may be used in practice.

EXAMPLE 3

Figure 8:
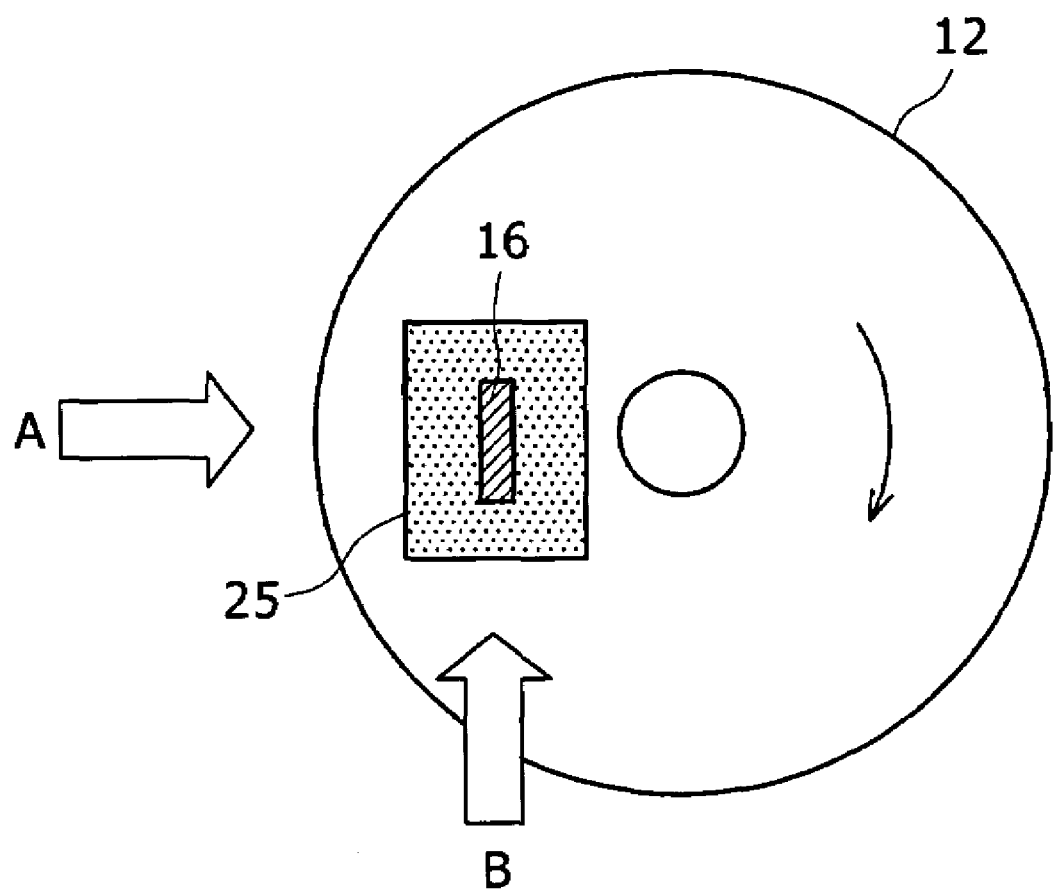
FIG. 8 is a plan view showing the configuration of a major part of a hologram recording/reproduction apparatus according to a third embodiment of the present invention.

FIG. 8 is a plan view showing the configuration of a major part of a hologram recording/reproduction apparatus according to a third embodiment of the present invention. It should be noted here that the same portions as those in the second embodiment above will be denoted by the same symbols used above, in the following description. A reference beam optical system in the hologram recording/reproduction apparatus in this embodiment has a structure in which a reference beam 200 having passed through a diffuser plate 16 mounted to the opening of an aperture 25 is led to irradiate a hologram recording material 12 therewith.

Figure 9A:
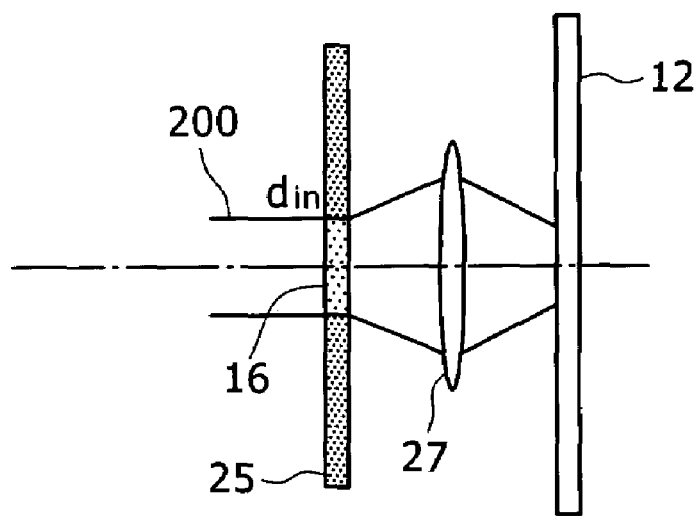
FIGS. 9A and 9B are side views as viewed in the direction of arrow A of FIG. 8, and a side view as viewed in the direction of arrow B of FIG. 8, respectively.
Figure 9B:
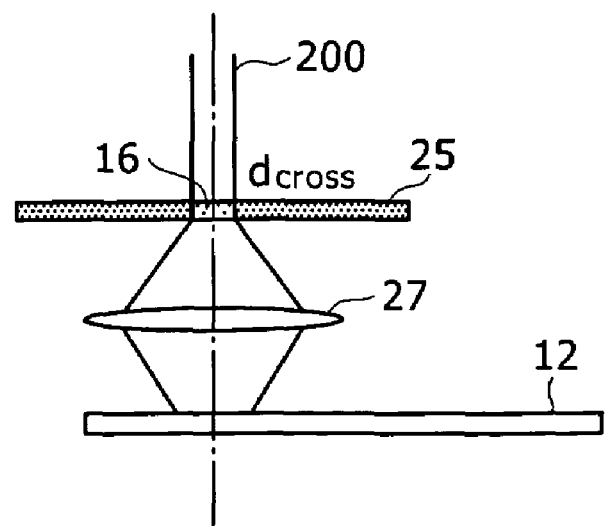

FIG. 9A is a side view of FIG. 8 as viewed in the direction of arrow A, and FIG. 9B is a side view of FIG. 8 as viewed in the direction of arrow B. The reference beam optical system of the hologram recoding/reproduction apparatus includes the aperture 25 mounted to the opening of the diffuser plate 16, and a lens 27, which functions as Fourier transform lens.

Now, the operation of this embodiment will be described. The reference beam 200 passes through the aperture 25, and is treated by the diffuser plate 16 to have its wave front speckle wave shaped, before being led by the lens 27 to irradiate the hologram recording material 12 therewith. The opening of the aperture 25 is also elongate in the track direction, and the diffuser plate 16 mounted to the opening is also elongate in the same manner, so that its length $d_{in}$ in the track direction is larger than its length $d_{cross}$ in the cross-track direction; thus, there is the relation of $d_{in} > d_{cross}$. With the relation of $d_{in} > d_{cross}$, it is possible to form a speckle pattern which is elongate in the cross-track direction.

According to this embodiment, the diffuser plate 16 is mounted to the aperture 25 having the opening shaped to be elongate in the track direction, and the reference beam 200 is passed through the aperture 25, whereby it is possible to perform recording under an increased tolerance in the cross-track direction while securing the necessary shift selectivity in the track direction, and, hence, to easily and stably perform the tracking servo at the time of reproduction.

Incidentally, it is seen from the theory of speckles that the diffusion angle of the diffuser plate 16 and the speckle size are normally independent from each other, and as seen from FIG. 8 and FIGS. 9A and 9B, it is desirable for the diffusion angle of the diffuser plate 16 to be so set that the reference beam 200 is spread to the required part of the hologram recording area. Such a control of the diffusion angle can be achieved by regulating the surface roughness of the diffuser plate 16, and a diffracting optical device or the like may be used in place of the diffuser plate 16 for this purpose.

EXAMPLE 4

Figure 10:
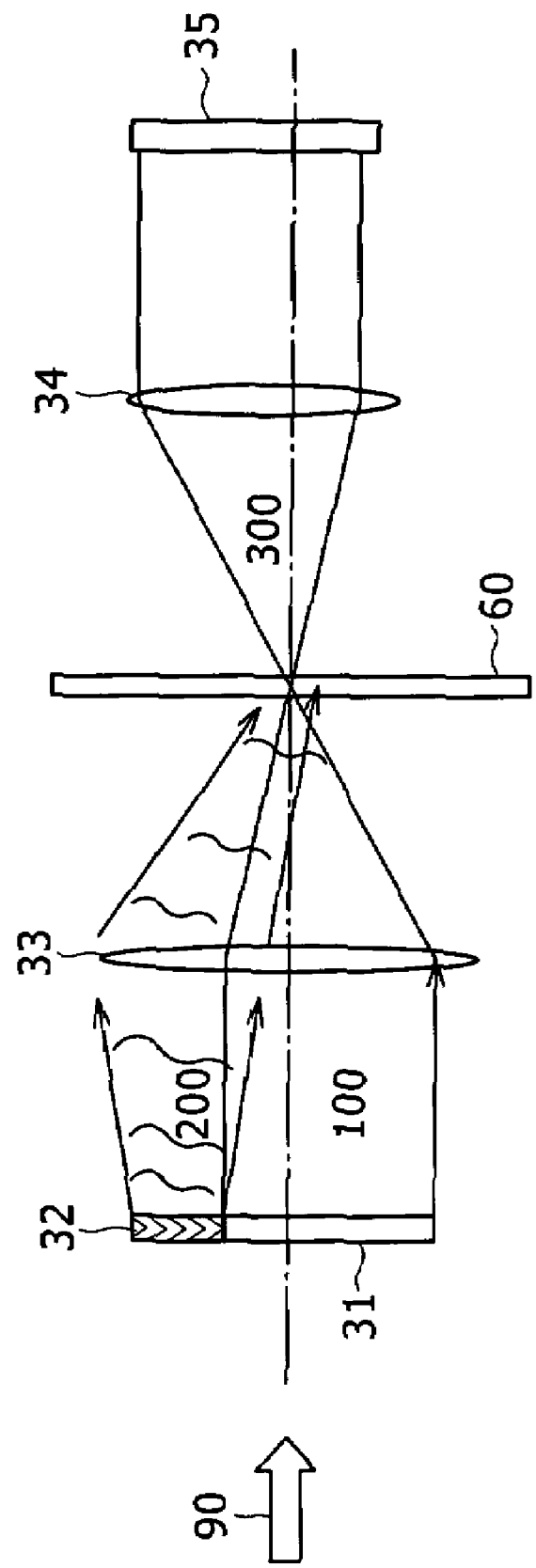
FIG. 10 is a plan view showing the configuration of a major part of a hologram recording/reproduction apparatus according to a fourth embodiment of the present invention.

FIG. 10 is a plan view showing the configuration of a major part of a hologram recording/reproduction apparatus according to a fourth embodiment of the present invention. The hologram recording/reproduction apparatus is for performing speckle multiplex recording by the in-line system (or coaxial system or collinear system) in which a signal beam 100 and a reference beam 200 are incident on a hologram recording material 60 from the same direction, and its optical system includes a space light modulator (SLM) 31 and a diffuser (diffuser plate) 32, a lens 33, the hologram recording material 60, a lens 34, and an image sensor 35, with the diffuser 32 disposed on the upper side of the space light modulator 31.

Figure 11:
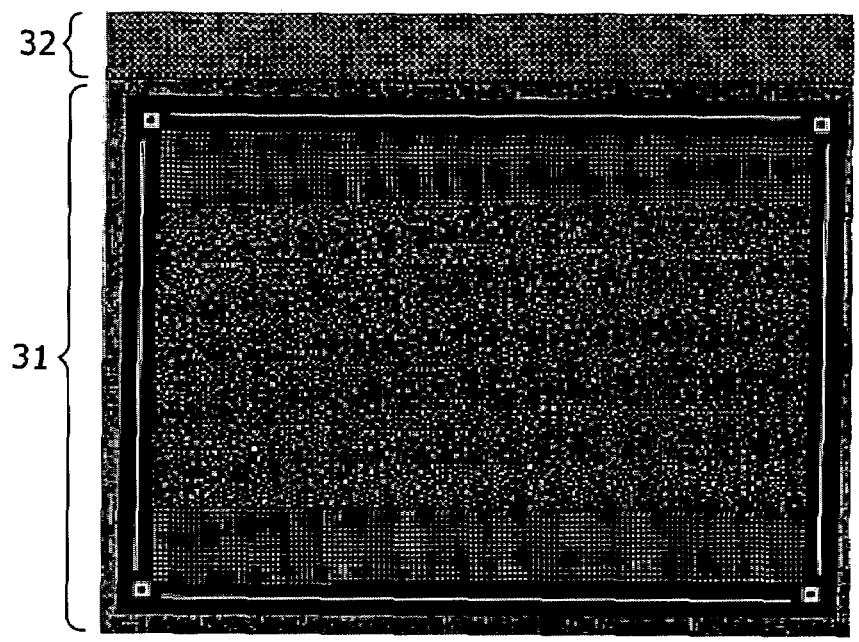
FIG. 11 is a front view of a space light modulator and a diffuser shown in FIG. 10.
Figure 12:
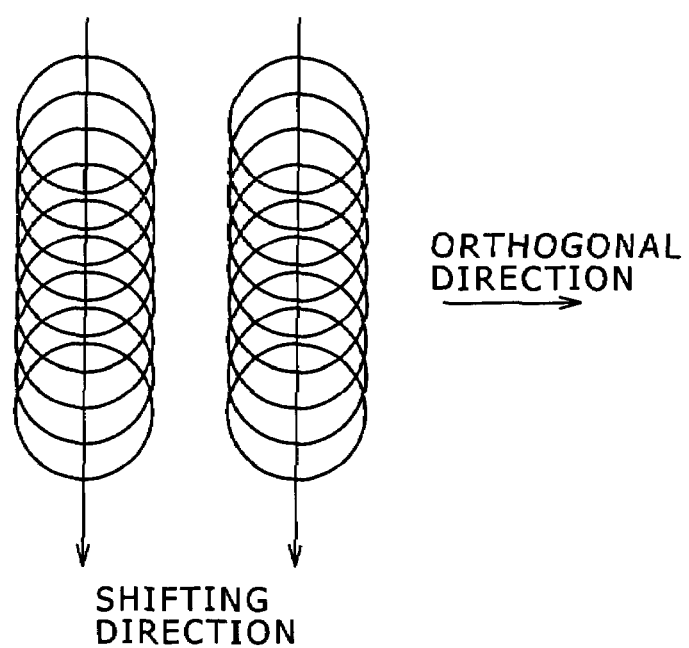
FIG. 12 illustrates the form of recording by the speckle multiplexing system.

FIG. 11 is a front view showing the space light modulator 31 and the diffuser 32. The elongate diffuser 32 is disposed on the space light modulator 31, alignment marks for detection of an origin for image processing are displayed in the four corners of the space light modulator 31, and a data page to be recorded is displayed on the inner side of the alignment marks. The shape of the diffuser 32 is determined according to the size of the tolerance required in the cross-track direction of the hologram recording material 60.

Now, the operation of this embodiment will be described. The laser beam 90 is incident on the space light modulator 31 and the diffuser 32. The laser beam 90 undergoes space light modulation according to the data page displayed on the space light modulator 31 to become a signal beam 100, and the laser beam 90 is diffused by the diffuser 32 to have its wave front speckle shaped to become a reference beam 200. The signal beam 100 and the reference beam 200 are condensed on the hologram recording material 60 by the lens 33, and an interference fringe of both the beams is recorded in the hologram recording material 60. When the irradiation with the laser beam 90 is conducted with the space light modulator 31 in the state of all black display, only the reference beam 200 diffused by the diffuser 32 is led by the lens 33 to irradiate the hologram recording material 60 therewith, whereby a reproduced signal beam 300 is generated and it is condensed by the lens 34 onto the image sensor 35, with the result of reproduction of the record data page.

Here, the shape of the diffuser 32 is determined by the size of the tolerance required in the cross-track direction of the hologram recording material 60, and, in the case of a horizontally elongate rectangle as shown in the figure, a speckle pattern elongate in the vertical direction is generated. In such a speckle pattern, the tolerance is larger vertically, and the shift selectivity is higher in the left-right direction. In view of this, the space light modulator 31 and the diffuser 32 are so arranged that the track direction of the hologram recording material 60 coincides with the longitudinal direction of the diffuser 32.

According to this embodiment, even in the hologram recording/reproduction apparatus based on the in-line system, by disposing the elongate diffuser 32 on one side of the space light modulator 31 so as to change the speckle pattern of the reference beam 200 in the track direction and in the cross-track direction, it is possible to perform recording under an increased tolerance in the cross-track direction while securing the shift selectivity required in the track direction, and, hence, to easily and stably perform the tracking servo at the time of reproduction.

Incidentally, while the space light modulator 31 and the diffuser 32 have been separate from each other in the above embodiment, the space light modulator 31 may be designed to function also as the diffuser; in that case, a random pattern is displayed on a part of the display surface of the space light modulator 31 to constitute a diffuser, and a control of the shift selectivity similar to the above can be performed by utilizing the display pattern.

The present invention is not limited to the above-described embodiments, and can be carried out in other various modes as to specific configuration, function, action, and effect, within the scope of the gist of the invention. For example, while the hologram recording material has been of the disk type in the above embodiments, a card type or other disk shaped hologram recording material may also be adopted and, in that case also, the same effects as above can be obtained, by changing the speckle pattern of the reference beam 200 in the track direction and in the cross-track direction.

What is claimed is:

1. A hologram apparatus for recording an interference fringe of a signal beam and a reference beam having a speckle pattern in a recording area of a hologram recording material, said hologram apparatus comprising:

speckle pattern generating unit for generating said speckle pattern so that said speckle pattern is different in form in the track direction and the cross-track direction of said recording area, said speckle pattern generating unit generating said speckle pattern such that said speckle pattern has a larger granular shape in said cross-track direction than in said track direction of said recording area.

2. A hologram apparatus as set forth in claim 1, wherein a numerical aperture of said reference beam as viewed from said hologram recording material is different in said track direction and said cross-track direction of said recording area, and said numerical aperture is smaller in said cross-track direction than in said track direction.

3. A hologram apparatus as set forth in claim 1, wherein said speckle pattern generating unit includes a diffuser plate or diffracting optical device having a shape shorter in said cross-track direction than in said track direction of said recording area.

4. A hologram apparatus as set forth in claim 1, wherein said speckle pattern generating unit includes said diffuser plate or diffracting optical device, a telecentric optical system for irradiating said hologram recording material with said reference beam having passed through said diffuser plate or diffracting optical device, and an aperture disposed in said telecentric optical system.

5. A hologram apparatus as set forth in claim 4, wherein said aperture has a shape elongated in said track direction of said recording area.

6. A hologram apparatus as set forth in claim 1, wherein said speckle pattern generating unit includes an aperture, a diffuser plate or diffracting optical device mounted to an opening portion of said aperture, and a lens for irradiating said hologram recording material with said reference beam having passed through said diffuser plate or diffracting optical device.

7. A hologram apparatus as set forth in claim 6, wherein said aperture has a shape elongated in said track direction of said recording area.

8. A hologram apparatus as set forth in claim 1, wherein said speckle pattern generating unit includes a diffuser plate or diffracting optical device different in diffusion angle in the track direction of said recording area and the cross-track direction, and a telecentric optical system for irradiating said hologram recording material with said reference beam having passed through said diffuser plate or diffracting optical device.

9. A hologram apparatus as set forth in claim 1, wherein said speckle pattern generating unit includes a diffuser disposed on a space light modulator for displaying a data page to be recorded, and the shape of said diffuser is determined by the magnitude of tolerance required in the cross-track direction of said hologram recording material.

10. A hologram apparatus as set forth in claim 1, wherein said hologram recording material is disk-like in shape.

11. A hologram recording method comprising: recording an interference fringe of a signal beam and a reference beam having a speckle pattern in a recording area of a hologram recording material, wherein the form of said speckle pattern in said reference beam is different in the track direction and the cross-track direction of said recording area, and said form of said speckle pattern has a larger granular shape in said cross-track direction than in said track direction of said recording area.

12. A hologram apparatus configured to record an interference fringe of a signal beam and a reference beam having a speckle pattern in a recording area of a hologram recording material, comprising:

a speckle pattern generator configured to generate said speckle pattern so that said speckle pattern is different in form in the track direction and the cross-track direction of said recording area, and to generate said speckle pattern so that said form of said speckle pattern has a larger granular shape in said cross-track direction than in said track direction of said recording area.

13. A hologram apparatus as set forth in claim 12, wherein a numerical aperture of said reference beam as viewed from said hologram recording material is different in said track direction and said cross-track direction of said recording area, and said numerical aperture is smaller in said cross-track direction than in said track direction.

14. A hologram apparatus as set forth in claim 12, wherein said speckle pattern generator includes a diffuser plate or diffracting optical device having a shape shorter in said cross-track direction than in said track direction of said recording area.

15. A hologram apparatus as set forth in claim 12, wherein said speckle pattern generator includes said diffuser plate or diffracting optical device, a telecentric optical system configured to irradiate said hologram recording material with said reference beam having passed through said diffuser plate or diffracting optical device, and an aperture disposed in said telecentric optical system.

16. A hologram apparatus as set forth in claim 15, wherein said aperture has a shape elongated in said track direction of said recording area.

17. A hologram apparatus as set forth in claim 12, wherein said speckle pattern generator includes an aperture, a diffuser plate or diffracting optical device mounted to an opening portion of said aperture, and a lens configured to irradiate said hologram recording material with said reference beam having passed through said diffuser plate or diffracting optical device.

18. A hologram apparatus as set forth in claim 17, wherein said aperture has a shape elongated in said track direction of said recording area.

19. A hologram apparatus as set forth in claim 12, wherein said speckle pattern generator includes a diffuser plate or diffracting optical device different in diffusion angle in the track direction of said recording area and the cross-track direction, and a telecentric optical system configured to irradiate said hologram recording material with said reference beam having passed through said diffuser plate or diffracting optical device.

20. A hologram apparatus as set forth in claim 12, wherein said speckle pattern generator includes a diffuser disposed on a space light modulator configured to display a data page to be recorded, and the shape of said diffuser is determined by the magnitude of tolerance required in the cross-track direction of said hologram recording material.

* * * * *